(12) United States Patent
Bruce

(10) Patent No.: US 6,366,101 B1
(45) Date of Patent: Apr. 2, 2002

(54) METHOD FOR LASER ANALYSIS FROM THE BACK SIDE AN ELECTRONIC CIRCUIT FORMED ON THE FRONT SIDE OF A SEMICONDUCTOR

(75) Inventor: Michael R. Bruce, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/385,773

(22) Filed: Aug. 30, 1999

(51) Int. Cl.[7] .............................................. G01R 31/28
(52) U.S. Cl. ....................................... 324/752; 324/765
(58) Field of Search ................................. 324/765, 750, 324/751, 752, 158.1, 73.1, 767, 719, 71.6; 250/459.1, 492.1, 341.4, 341.8; 438/14–18; 257/48; 356/400

(56) References Cited

U.S. PATENT DOCUMENTS

| | | | | |
|---|---|---|---|---|
| 4,625,167 A | * | 11/1986 | Fitzpatrick | 324/235 |
| 4,638,155 A | * | 1/1987 | Dorr | 324/175 |
| 4,968,932 A | * | 11/1990 | Baba et al. | 324/767 |
| 5,334,540 A | * | 8/1994 | Ishii | 324/765 |
| 5,430,305 A | | 7/1995 | Cole, Jr. et al. | |
| 5,798,838 A | * | 8/1998 | Taniguchi et al. | 356/401 |

OTHER PUBLICATIONS

Cullis, A.G., Webber, H. C., and Baily, P., *A Device for Laser Beam Diffusion and Homogenisation*, Scientific Instruments–Journal of Physics E, vol. 12 No. 8, Aug. 1979, pp. 688–689.

Kozma, A. and Christensen, C., *Effects of Speckle on Resolution*, Journal of the Optical Society of America, vol. 66 No. 11, Nov. 1976, pp. 1257–1260.

Martienssen, W. and Spiller, E., *Coherence and Fluctuations in Light Beams*, American Journal of Physics, vol. 32 No. 1–12, 1964, pp. 919–926 (unavailable month).

*Thin Film Processes II*, vol. 2, 1991, p. 801 (unavailable month).

* cited by examiner

Primary Examiner—Vinh P. Nguyen

(57) ABSTRACT

According to an example embodiment, an electronic circuit formed upon a front side surface of a semiconductor substrate having opposed front side and back side surfaces is analyzed. The back side surface of the semiconductor substrate is disposed in an optical path of a laser source. A coherency reducer is disposed in the optical path between the laser source and the back side surface. Using the laser source, a beam of laser light is directed toward the back side surface, and an electrical response from the electronic circuit is detected therefrom. The use of the coherency reducer improves the ability to detect the response.

22 Claims, 6 Drawing Sheets

US 6,366,101 B1

METHOD FOR LASER ANALYSIS FROM THE BACK SIDE AN ELECTRONIC CIRCUIT FORMED ON THE FRONT SIDE OF A SEMICONDUCTOR

FIELD OF THE INVENTION

This invention relates to analysis of integrated circuits having electronic circuits formed on the front side surfaces, and more particularly to failure analysis and fault isolation techniques employed in cases where the front side surfaces are inaccessible, or where several layers of metal interconnects prevent the use of more conventional circuit probing techniques upon the front side surface.

BACKGROUND OF THE INVENTION

During manufacture of an integrated circuit (e.g., a microprocessor), electronic components are formed upon and within a front side surface of a semiconductor substrate having opposed front side and back side surfaces. The electronic components are connected together by electrically conductive interconnect (i.e., signal) lines, forming an electronic circuit. Signal lines which are to be connected to external devices are terminated at flat metal contact regions called input/output (I/O) pads. Following manufacture, the integrated circuit (i.e., "chip") is typically secured within a protective semiconductor device package. Each I/O pad of the chip is then connected to one or more terminals of the device package. The terminals of a device package are typically arranged about the periphery of the package. The I/O pads of the chip are electrically connected to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines which need to be connected to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead coplanarity, adversely affecting PCB assembly yields. In addition, the lengths of signal lines from chip I/O pads to device package terminals increase with the number of terminals, and the high-frequency electrical performance of larger peripheral-terminal device packages suffer as a result.

Grid array semiconductor device packages have terminals arranged in a two-dimensional array across an underside surface of the device package. As a result, the physical dimensions of grid array device packages having hundreds of terminals are much smaller than their peripheral-terminal counterparts. Such smaller packages are highly desirable in portable device applications such as laptop and palm top computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array ("BGA") device package. FIG. 1 is a cross-sectional view of an exemplary ball grid array (BGA) device 10 including an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a front side surface of semiconductor substrate 20 during wafer fabrication. The electronic components are connected by electrically conductive interconnect lines, forming an electronic circuit. Multiple input/output (I/O pads) 24 are also formed within circuit layer 22. I/O pads 24 are typically coated with solder, forming solder "bumps" 26.

The integrated circuit is attached to the package substrate using the controlled collapse chip connection (C4® or "flip chip") method. During the C4® mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an "underfill" material 28 which encapsulates the C4® connections and provides other mechanical advantages.

Package substrate 14 may be made of, for example, fiberglass-epoxy printed circuit board material or ceramic material (e.g., aluminum oxide, alurmina, $Al_2O_3$, or aluminum nitride, AlN). Package substrate 14 includes one or more layers of signal lines (i.e., interconnects) which connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PC assembly, BGA device 10 is attached to the PCB by reflow of solder balls 30 just as the integrated circuit is attached to the package substrate.

The C4® mounting of integrated circuit 12 to package substrate 14 prevents physical access to circuit layer 22 for failure analysis and fault isolation. However, several analytic and diagnostic techniques developed to reveal defects and logic states within integrated circuits are also useful when applied to flip chip grid array devices. Some of these techniques involve stimulation of a target portion of circuit layer 22 with electromagnetic radiation. For example, silicon substrates transmit a significant fraction of incident laser light having wavelengths from about 1,000 nanometers (nm) to upwards of 1,800 nm. Photons of laser light with wavelengths from about 1,000 nm to approximately 1,200 nm have sufficient energy to create electron-hole pairs in some silicon substrates used for wafer fabrication when absorbed during collisions with atoms of elements within the silicon substrates. The electrons and holes (i.e., charge carriers) thus created cause detectable changes in (i.e., stimulate) an isolated target portion of circuit layer 22. Photons of laser light having wavelengths greater than or equal to about 1,300 nm lack sufficient energy to create electron-hole pairs during collisions. However, the magnitude and/or phase of a reflected portion of an incident laser beam having a wavelength of about 1,300 or greater is affected by electric fields and charge modulation effects existing within circuit layer 22. Techniques which detect the reflected portion allow imaging within the silicon substrates.

FIG. 2 is a cross sectional view of integrated circuit 12 of BGA device 10 of FIG. 1 undergoing such electromagnetic stimulation. A beam of laser light (i.e., an incident beam 32) having a sufficient wavelength is directed onto an upward-facing back side surface 34 of integrated circuit 12. A portion of the incident beam (i.e., a reflected portion 36) is reflected from back side surface 34, and the remainder (i.e., a transmitted portion 38) is transmitted into semiconductor substrate 20. Photons of transmitted portion 38 are absorbed within semiconductor substrate 20 during collisions with atoms of elements within semiconductor substrate 20. The electrons and holes created when the photons are absorbed near target portion 40 of circuit layer 22 stimulate the electronic components within target portion 40. Some analytic methods detect changes in the amount of electrical power delivered to integrated circuit 12 subject to such electromagnetic stimulation. For example, U.S. Pat. No. 5,430,305 describes the scanning of an incident laser beam across a back side surface of an integrated circuit and the detection of resultant changes in the voltage of a constant-current power supply delivering electrical power to the integrated circuit in order to image to "map" logic states of electronic components within the circuit layer.

When photons of transmitted portion 38 strike electronic components or encounter electric fields within target portion 40, part of transmitted portion 38 is reflected back toward back side surface 34. At the interface between semiconductor substrate 20 and the surrounding air, part of the light emanating from target portion 40 is reflected back into semiconductor substrate 20, and the remainder emerges from the back side surface as an exit beam 42. Scanning laser beam microscopes scan incident beam 32 across a surface of a specimen (e.g., semiconductor substrate 20) and detect the intensity of exit beam 42 emerging from the surface, allowing imaging of structures within the specimen.

Problems have been observed in imaging the circuit and stimulating the electronic components in accordance with the above described techniques. In imaging, significant background laser intensity levels have been observed. While stimulating the electronic components, weak response levels have been experienced. In addition, interference from reflections and other sources typically impede the efficacy of imaging processes. When a coherent laser beam is used to image diffuse objects, the image is degraded by interference reflections from the diffuse object. It would therefore be desirable to have a method that improves laser imaging, reduces interference, and increases response levels of electronic components when stimulated with laser light.

SUMMARY OF THE INVENTION

The present invention is exemplified in a number of implementations and applications, some of which are summarized below. According to an example embodiment, the present invention is directed to a method for analyzing an electronic circuit formed upon a front side surface of a semiconductor substrate having opposed front side and back side surfaces. The back side surface of the semiconductor substrate is disposed in the optical path of a laser source. A coherency reducer is placed in the optical path between the laser source and the semiconductor substrate. A beam of laser light is directed toward the back side surface via the coherency reducer, and an electrical response is detected from the electronic circuit.

According to another example embodiment of the present invention, an apparatus is arranged to analyze an electronic circuit formed near a front side surface of a semiconductor substrate having opposed front side and back side surfaces. A laser source is arranged to direct a beam of laser light toward the back side surface of the semiconductor substrate. A testing arrangement is configured and arranged to dispose the back side surface of the semiconductor substrate in an optical path from the laser source. A coherency reducer is disposed between the laser source and the back side in the optical path from the laser source to the back side. A receiver is configured and arranged to detect a response from the electronic circuit.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
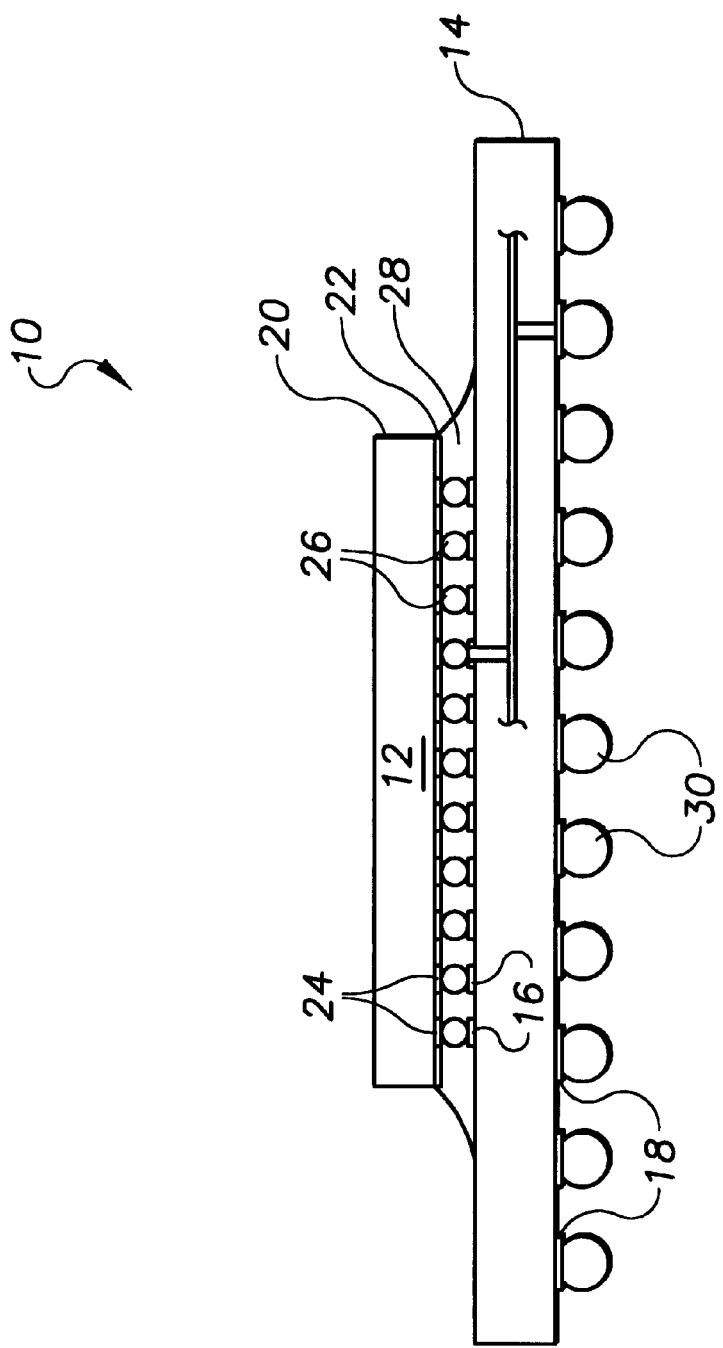
FIG. 1 is a cross-sectional view of an exemplary ball grid array (BGA) device including an integrated circuit mounted upon a larger package substrate, consistent with an example embodiment of the present invention, wherein an electronic circuit is formed upon a front side of a semiconductor substrate of the integrated circuit, and wherein the front side surface of the semiconductor substrate is connected to the package substrate such that the front side surface is inaccessible with conventional circuit probing techniques.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from back side analysis. While the present invention is not necessarily limited to such devices, various aspects of the invention may be appreciated through a discussion of various examples using this context.

Various methods and apparatuses for analyzing semiconductor devices having a circuit side opposite a back side involve imaging the circuit side via the back side. A particular difficulty that has plagued such imaging is the proliferation of interference patterns which adversely affect the imaging pattern. Interference can occur and be influenced in several manners, such as via the application of non-uniform laser beams, the existence of a non-planar back side surface, the illumination of diffuse objects with coherent laser radiation, and the existence of non-uniform indexes of refraction for silicon in such devices. Such interference patterns hinder the applicability and accuracy of circuitry imaging via the back side. According to an example embodiment of the present invention, it has been discovered that interference patterns resulting from laser-scanning the back side of semiconductor devices can be reduced by the application of a coherency reducer to the laser beam path between the laser source and the back side. The coherency reducer is applied to the laser beam, disperses it, and results in substantially interference-free image patterns obtained via the back side of the semiconductor device.

According to another example embodiment of the present invention, a semiconductor device having opposed front side and back side surfaces and an electronic circuit formed upon the front side surface is scanned via the back side with a laser beam. The laser beam is generated at a laser source that is directed at the back side and passes through a coherency reducer prior to reaching the back side of the device. The laser beam may, for example, include a beam having a wavelength to which the substrate is substantially transparent, such as about 1064 nanometers. A neodymium:yttrium-aluminum-garnet (Nd:YAG) laser can be used to produce a wavelength of about 1064 nanometers. The coherency reducer degrades the coherency of the laser beam, effectively dispersing the beam that reaches the surface. A response, such as an electrical response or an image, is detected and used for analyzing the device.

The coherency reducer may include several devices. For example, a diffusers including scratched glass can be used, and are available from Edmunds Scientific, Inc., of Barrington, N.J., or part number 13FSD003 from Melles/Griot, Inc. of Irvine, Calif. In another example, a waveguide is used to reduce the coherency of the laser. A typical waveguide includes a glass tube having about a ¼ inch in diameter, and is between about 3 and 4 feet long. Still another example diffuser includes stress multi-mode fibers. When formed in an arc having about 180 degrees of curvature, the fibers effectively, reduce the coherency of the beam.

Figure 4:
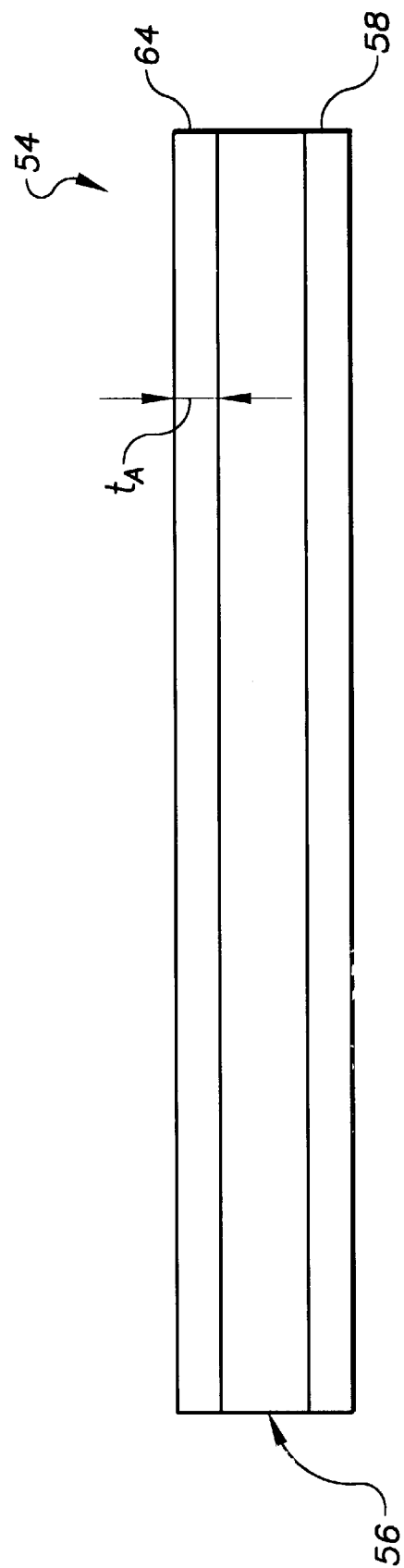
FIG. 4 is a cross-sectional view of a semiconductor undergoing analysis following application of a layer of an antireflective coating material, according to another example embodiment of the present invention.

In another more particular example embodiment, and referring to FIG. 4, an antireflective coating 64 having a thickness $t_A$ is formed on the back side of a semiconductor device 54. The thickness may, for instance, be controlled to be about ¼ the wavelength of a laser to be used for analysis. In this case, when a portion of an incident laser beam reflected from the lower surface of the antireflective layer 64 arrives at the upper surface of the layer of antireflective coating material 64, it has traveled half a wavelength father than a portion of the incident laser reflected from the upper surface of the antireflective coating 64. The reflected portions are thus 180 degrees out of phase, resulting in total destructive interference such that they cancel each other out at the upper surface of the layer of antireflective coating material 64. Thus no laser light is reflected from the antireflective coating material 64 into the surrounding air. An antireflective coating that includes material such as lead fluoride is useful for this application.

Figure 2:
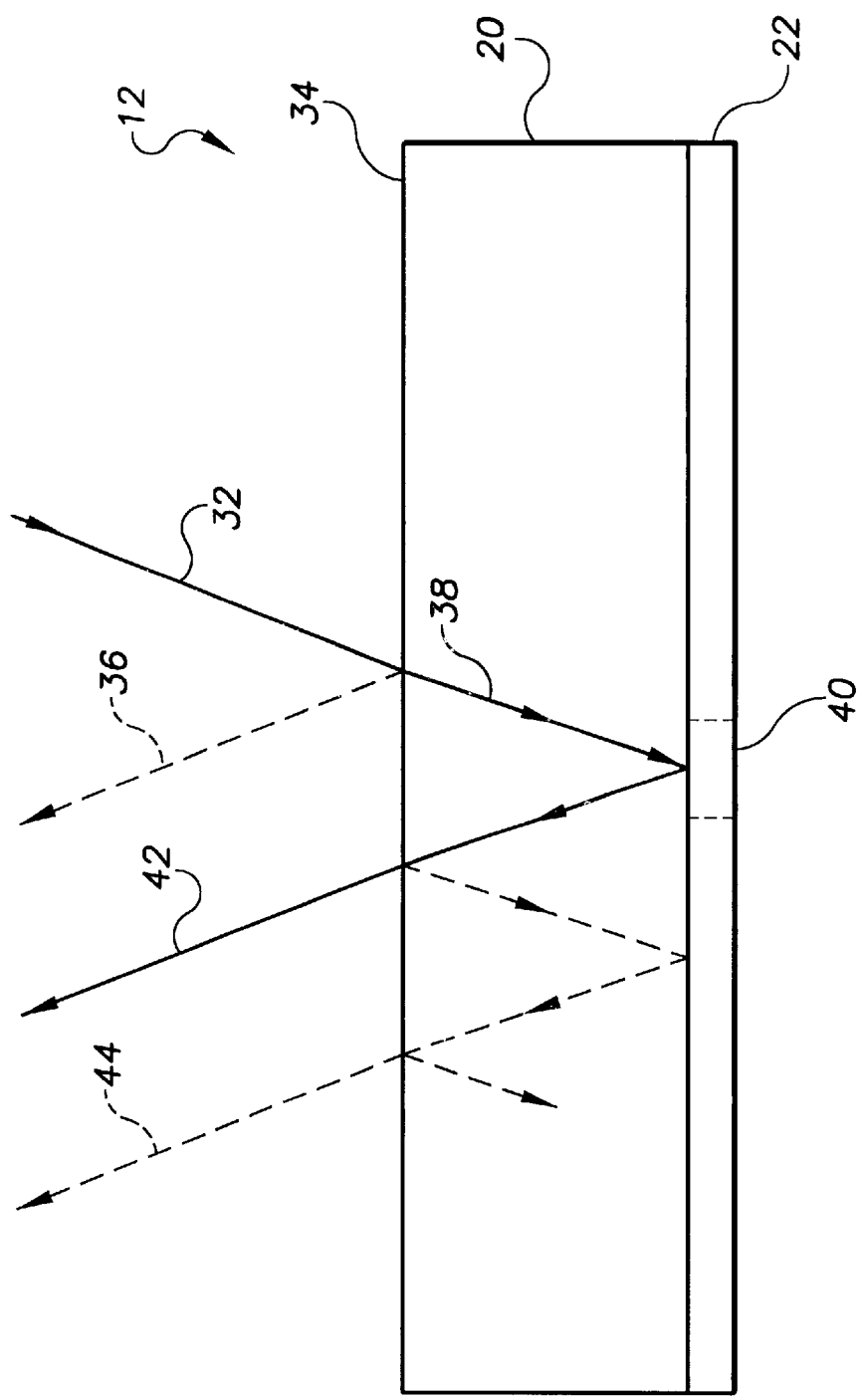
FIG. 2 is a cross-sectional view of the integrated circuit of the BGA device of FIG. 1 undergoing analysis, wherein an upward-facing back side surface of the semiconductor substrate of the integrated circuit is subjected to a beam of laser light directed onto the back side surface.
Figure 3:
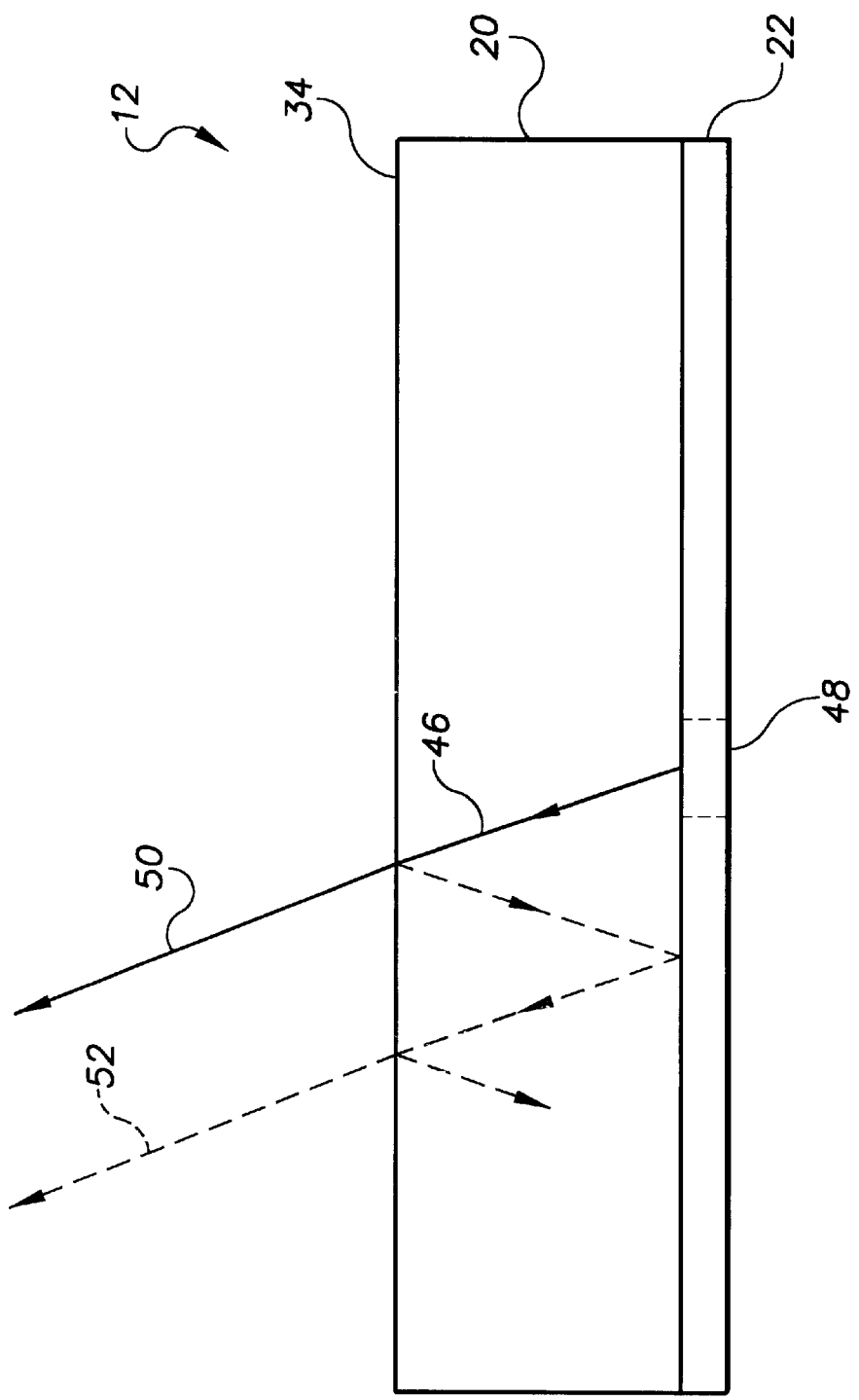
FIG. 3 is a cross-sectional view of the integrated circuit of the BGA device of FIG. 1 undergoing analysis.

The use of coherency reduction is beneficial for several applications. For example, FIG. 2 shows the application of a laser beam 32 to the back side 34 of a semiconductor device 12. The laser beam 32 is reflected at the back side 34 and transmitted as beam 38. Beam 38 is reflected at a device 40 and at the interface between the back side 34 and the circuit side 22, resulting in reflected beams 36, 42, and 44. In addition to direct reflection, other responses can be induced by the laser. For instance, FIG. 3 shows a laser-induced emission 46 from a device 48 in the circuit side 22 of a semiconductor device 12 (the application of the laser beam is not shown). The laser may, for example, generate optical beam induced current (OBIC) via the production of electron hole pairs. The OBIC can sufficiently excite the device 48 to cause an emission 46. In another example application, The detection of reflections or other responses induced by the laser beam can be hindered by the laser beam reflections themselves, as well as by other interference generated by the laser beam incident upon the semiconductor device. A reduction of the coherency of the beam can reduce the effect of the interference.

Figure 5:
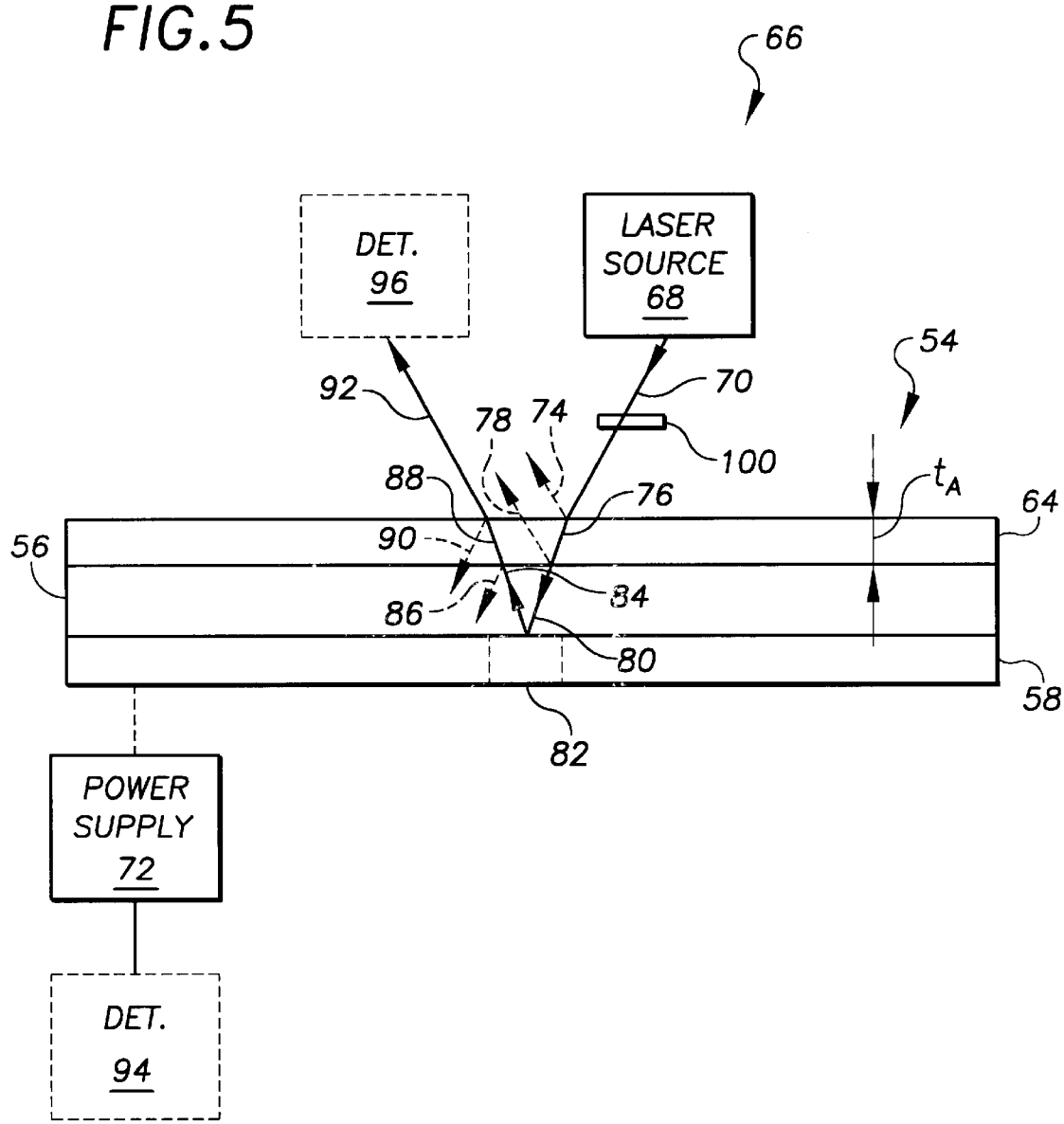
FIG. 5 is a cross-sectional view of the semiconductor of FIG. 4 undergoing analysis, according to another example embodiment of the present invention.

Referring now to FIG. 5, and according to another example embodiment of the present invention, an apparatus 66 is used for imaging a semiconductor device 54. A coherency reduction device 100 is placed in the path of a laser beam 70 directed from a source 68 to the back side of the semiconductor device 54. FIG. 5 shows an antireflective layer 64 having a thickness tA formed on the back side. Although the antireflective layer 64 aids in the reduction of undesirable reflections, the application of this example embodiment does not necessarily require the formation of the antireflective layer 64. The laser beam 70 passes through the coherency reduction device 100 and into the back side of the semiconductor device 54. The use of the antireflective layer can effectively cancel any reflection if it does occur, including reflections 86 and 90 that occur as the reflected beam 84 travels back through the antireflective layer 64. The laser beam 70 is transmitted as beams 76 and 80, respectively, and reaches a device 82 in the circuit side 58. A reflection 84 from the device 82 travels back through the substrate 56 and encounters the antireflective layer 64, where it is transmitted as reflection 88 and 92, respectively. The reflection 92 is detected at a detector 96, and can be used to image the device. Since the source beam 70 has been passed through a coherency reduction device 100, the reflection 92 includes less interference and is of higher quality than an image obtained via a coherent beam.

According to another example embodiment of the present invention, and referring again to FIG. 5, a power supply 72 is coupled to the semiconductor device 54. The power supply is used to induce a response from circuitry or devices, such as device 82, in the semiconductor device 54. The power supply can be monitored at detection device 94 in connection with analyzing. Using the power supply 72 to induce a response may, for example, include supplying an electrical voltage level and current to the circuit prior to directing the laser beam 70 at the back side of the device 54. Responsive to the laser, the voltage level varies when the current is maintained at a constant, and the voltage can be used in connection with analyzing the device 54. Emissions from the device 82 may include the emission of a photon or other responses that can be detected using a laser scanning microscope. The use of a coherency reduction device 100 reduces the interference introduced by an incident laser beam and improves the response detected from the device 82.

Figure 6:
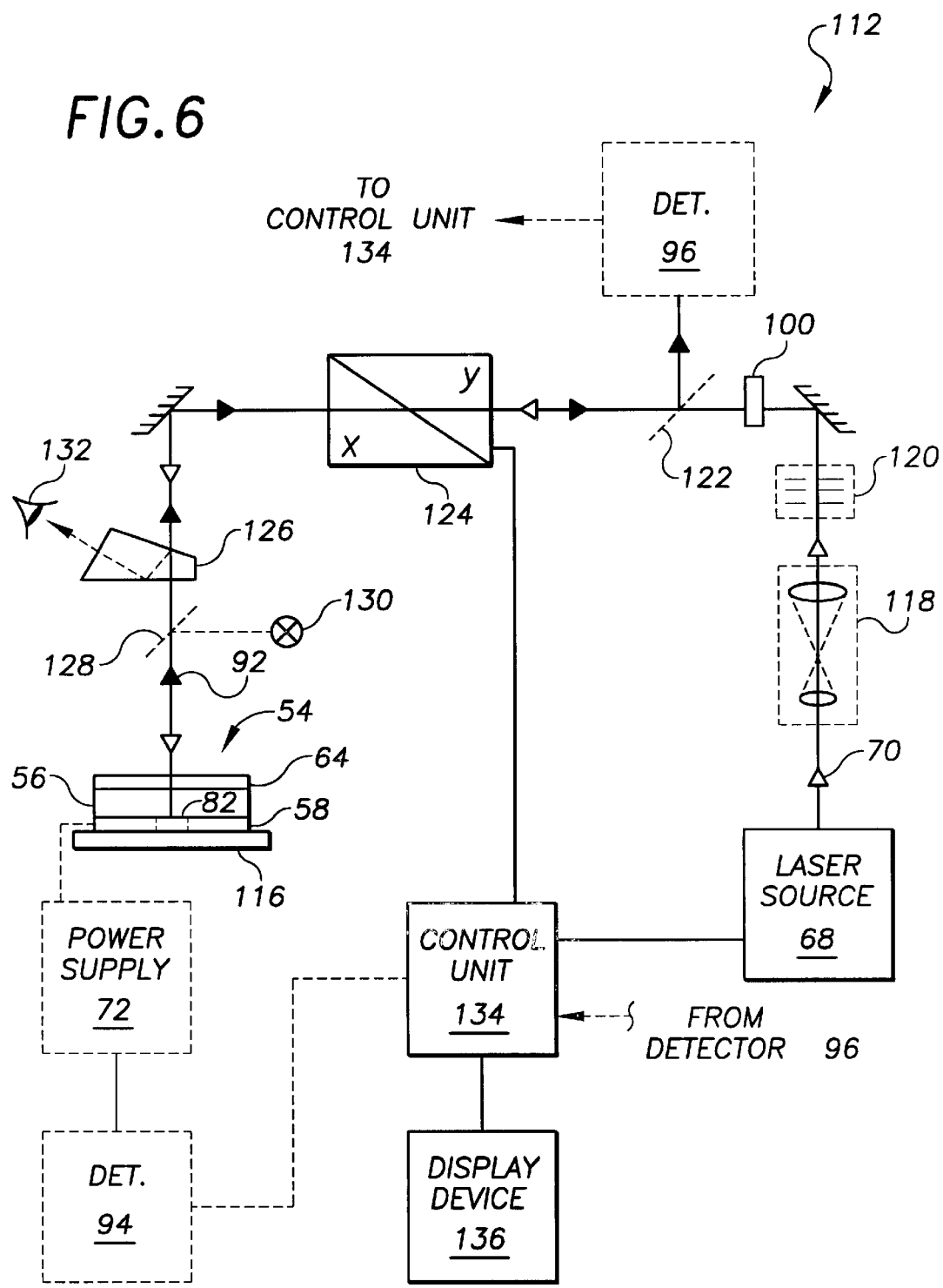
FIG. 6 is a block diagram of another example embodiment of the present invention.

FIG. 6 his a block diagram of an arrangement 112 for implementing circuit analysis techniques using a coherency reduction device, according to still another example embodiment of the present invention. Semiconductor substrate 56 is positioned upon a holder 116 such that the back side surface of semiconductor substrate 56 (shown covered by a layer of antireflective coating material 64) is exposed for analysis. Laser source 68 of arrangement 112 produces incident beam 70 as described above. Incident beam 70 passes through beam expansion optics 118 which control the cross-sectional area (i.e., width) of incident beam 70, determining the illuminated area or "spot size" upon the back side surface of semiconductor substrate 56 (i.e., the upper surface of the layer of antireflective coating material 64). Incident beam 70 then passes through an attenuating filter 120 which controls the intensity of incident beam 70. Attenuating filter 120 operates in a manner such that incident beam 70 is given a predetermined intensity. After passing through the filter 120, the beam 70 passes through a coherency reduction device 100 positioned in the path of the laser beam 70. The coherency reduction device 100 may be positioned via a fastener, holder, or other device capable of positioning it in the laser path. Apparatus 112 may also include a first beam splitter 122, a detector 96, and a detector 94.

When apparatus 112 includes first beam splitter 122 and detector 96, incident beam 70 passes through first beam splitter 122 before entering an x-y deflecting unit 124. X-y deflecting unit 124 determines the position of the point of entry of incident beam 70 into the back side surface of semiconductor substrate 56 in order to illuminate target portion 82 of circuit layer 58. X-y deflecting unit 124 permits the scanning of incident beam 70 across the back side surface of semiconductor substrate 56. Incident beam 70 then passes through a viewing lens 126 and a second beam splitter 128, striking the upper surface of the layer of antireflective coating material 64 upon the back side surface of semiconductor substrate 56. In an alternate embodiment, power supply 72 is operably coupled to circuit layer 58 of integrated circuit 54 and supplies electrical power to the electronic circuit within circuit layer 58 during analysis.

Incident beam 70 enters the back side surface of semiconductor substrate 56 through the layer of antireflective coating material 64, and exit beam 92 emerges from the upper surface of the layer of antireflective coating material 64 as described above. Photons of incident beam 70 reaching target portion 82 of circuit layer 58 can be used to image the target portion, or to stimulate electronic components within target portion 82. As described above, thickness tA of the layer of antireflective coating material 64 is preferably one-fourth the wavelength of incident beam 70 within the layer of antireflective coating material 64. As a result, no laser light is reflected from the upper surface of the layer of antireflective coating material 64 into the surrounding air, and no laser light is reflected from the underside surface of the layer of antireflective coating material 64 into semiconductor substrate 56.

In a more particular example embodiment of the present invention, a visible light source 130 produces visible light for viewing of the upper surface of integrated circuit 54 by a user. Second beam splitter 128 directs visible light produced by visible light source 130 onto the same area or "spot" where incident beam 70 enters the back side surface of semiconductor substrate 56 through the layer of antireflective coating material 64. Visible light reflected from the back side surface of semiconductor substrate 56 follows the same path as exit beam 92. The reflected visible light passes through second beam splitter 128 and into viewing lens 126. Viewing lens 126 directs the reflected light into the user's eye 132 as shown.

Apparatus 112 may also include a control unit 134 and a display unit 136, according to another example embodiment of the present invention. Control unit 134 is coupled to laser source 68 and x-y deflecting unit 124. Control unit 134 may direct x-y deflecting unit 124 to scan incident beam 70 across the upper surface of the layer of antireflective coating material 64. In this case, detector 94 produces an output signal dependent upon the output voltage produced by power supply 72. Control unit 134 receives the output signal produced by detector 94, computes the response of the electronic circuit as described above, and generates a set of output signals representing a two-dimensional image of the electric fields within circuit layer 58. Display device 136 receives the set of output signals from control unit 134 and visually displays the two-dimensional image of the electronic components within circuit layer 58.

In another example embodiment of the present invention, control unit 134 is coupled to detector 96. Exit beam 92 follows the same path as incident beam 70, passing through second beam splitter 128, viewing lens 126, and x-y deflecting unit 124. First beam splitter 122 directs exit beam 92 toward detector 96. Control unit 134 may direct x-y deflecting unit 124 to scan incident beam 70 across the upper surface of the layer of antireflective coating material 64. In this case detector 96 produces an output signal dependent upon the intensity of exit beam 92 emerging from the back side surface of semiconductor substrate 56 through the layer of antireflective coating material 64. Control unit 134 receives the output signal produced by detector 96, computes the response of the electronic circuit as described above, and generates a set of output signals representing a two-dimensional image of the electronic components within circuit layer 58. Display device 136 receives the set of output signals from control unit 134 and visually displays the two-dimensional image of the electronic components within circuit layer 58.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing, using a laser source, an electronic circuit formed upon a front side surface of a semiconductor substrate having opposed front side and back side surfaces, comprising:

disposing the back side surface of the semiconductor substrate in an optical path from the laser source;

disposing a coherency reducer device in the optical path from the laser source to the semiconductor substrate and reducing interference reflections of the laser source therewith;

directing a beam of laser light through the coherency reducer device and toward the back side surface; and imaging the electronic circuit using a reduced interference reflection of the laser light.

2. The method of claim 1, wherein the coherency reducer is a diffuser.

3. The method of claim 2, wherein the diffuser comprises glass.

4. The method of claim 1, wherein the coherency reducer is a waveguide.

5. The method of claim 4, wherein the waveguide comprises a glass tube having a diameter of about ¼ inch and a length of between about 3–4 feet.

6. The method of claim 1, wherein the coherency reducer is comprised of stress multi-mode fibers.

7. The method of claim 6, wherein the stress multi-mode fibers are arranged in a curved pattern of about 180 degrees.

8. The method of claim 1, further comprising forming a layer of antireflective material on the back side surface.

9. The method of claim 8, wherein the antireflective material is comprised of lead fluoride.

10. The method of claim 8, wherein the layer of antireflective material is of a thickness approximately equal to one-quarter the wavelength of the laser light.

11. The method of claim 1, further comprising supplying an electrical voltage level and current to the electronic circuit prior to directing the beam of laser light, wherein the voltage level varies while maintaining a constant electrical current, and the response comprises a change in the voltage level.

12. The method of claim 1, wherein the laser light has a wavelength at which the substrate is substantially transparent.

13. The method of claim 12, wherein the wavelength of the laser light is approximately 1064 nanometers.

14. The method of claim 13, further comprising generating electron-hole pairs in the electronic circuit.

15. The method of claim 1, wherein the laser light is generated from a laser source of type neodymium:yttrium-aluminum-garnet (Nd:YAG).

16. The method of claim 1, wherein imaging the semiconductor device includes forming a substantially interference-free image.

17. The method of claim 1, wherein disposing a coherency reducer device in the optical path from the laser source includes disposing the coherency reducer between an output of a laser-scanning microscope and a semiconductor substrate.

18. An arrangement for analyzing an electronic circuit formed near a front side surface of a semiconductor substrate having opposed front side and back side surfaces, the arrangement comprising:

means for disposing the back side surface of the semiconductor substrate in an optical path from the laser source;

a coherency reducer device in the optical path from the laser source to the semiconductor substrate and reducing interference reflections of laser light therewith;

means for directing a beam of laser light through the coherency reducer device and toward the back side surface; and means for imaging the electronic circuit using a reduced interference reflection of the laser light.

19. An apparatus for analyzing an electronic circuit formed upon a front side surface of a semiconductor substrate having opposed front side and back side surfaces, the arrangement comprising:

a testing arrangement configured and arranged to dispose the back side surface of the semiconductor substrate in an optical path from the laser source;

a laser source arranged to direct a beam of laser light toward the back side surface;

a coherency reducer disposed in the optical path from the laser source to the back side and adapted to reduce interference reflections of laser light; and a receiver configured and arranged to image the electronic circuit using a reduced interference reflection of the laser light.

20. An Apparatus, according to claim 19, wherein the coherency reducer comprises at least one of: a diffuser, a waveguide, and a stress multi-mode fiber.

21. An apparatus, according to claim 19, wherein the laser source includes a neodymium:yttrium-aluminum-garnet (Nd:YAG) source.

22. The apparatus of claim 19, wherein the laser source includes a laser-scanning microscope, and wherein the coherency reducer is disposed between the output of the laser-scanning microscope and the semiconductor substrate.

* * * * *

UNITED STATES PATENT AND TRADEMARK OFFICE
CERTIFICATE OF CORRECTION

PATENT NO.   : 6,366,101 B1                                    Page 1 of 1
DATED        : April 2, 2002
INVENTOR(S)  : Bruce It is certified that error appears in the above-identified patent and that said Letters Patent is hereby corrected as shown below:

Column 6,
Line 25, "application, The" should read -- application, the --.
Line 37, and Column 7, line 56, "tA" should read -- $t_A$ --.

Column 7,
Line 9, "his" should read -- is --.

Column 10,
Line 33, "An Apparatus" should read -- An apparatus --.

Signed and Sealed this

Eighth Day of October, 2002

*Attest:*

JAMES E. ROGAN
*Attesting Officer*   *Director of the United States Patent and Trademark Office*